United States Patent
Xiao et al.

(10) Patent No.: US 8,142,216 B1
(45) Date of Patent: Mar. 27, 2012

(54) ELECTRICAL CONNECTOR WITH IMPROVED ACTUATOR

(75) Inventors: Yu-Bao Xiao, Shenzhen (CN); Wen He, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/241,290

(22) Filed: Sep. 23, 2011

(30) Foreign Application Priority Data

Nov. 3, 2010 (CN) .......................... 2010 2 058924

(51) Int. Cl.
*H01R 13/629* (2006.01)
(52) U.S. Cl. ........................................ 439/342
(58) Field of Classification Search .................. 439/342, 439/259, 260
See application file for complete search history.

(56) References Cited

U.S. PATENT DOCUMENTS

| | | | |
|---|---|---|---|
| 6,669,498 B2 * | 12/2003 | Okita et al. | 439/342 |
| 7,056,140 B1 * | 6/2006 | Jiang | 439/342 |
| 7,938,666 B2 | 5/2011 | Xiao et al. | |
| 7,963,791 B1 * | 6/2011 | Cai | 439/342 |
| 8,021,180 B2 * | 9/2011 | Ju | 439/342 |

* cited by examiner

*Primary Examiner* — Tho D Ta
(74) *Attorney, Agent, or Firm* — Wei Te Chung; Andrew C. Cheng; Ming Chieh Chang

(57) ABSTRACT

An electrical connector includes a base having a plurality of terminals received therein and defining a first aperture extending therethough, a cover mounted on the base and having a second aperture corresponding to the first aperture and an actuating device actuating the cover moving along the base in a front-to-back direction. The actuating device includes three separated parts called as a rotating shaft define a position rib, an eccentric wheel and a concentric wheel assembled on the rotating shaft from an up-to-down direction. The eccentric wheel used as a cam has a first slot engaging with the position rib. The concentric wheel received in the second aperture has a second slot engaging with the position rib. The eccentric wheel is received in the second aperture to actuate the cover move along the base.

18 Claims, 4 Drawing Sheets

ELECTRICAL CONNECTOR WITH IMPROVED ACTUATOR

BACKGROUND OF THE INVENTION

1. Field of the Invention

The present invention relates to an electrical connector for electrically connecting a central processing unit (CPU) to a printed circuit board (PCB), more particularly relates to an electrical connector with an actuating device having stable and reliable driving performance after long time used.

2. Description of Related Art

An electrical connector for electrically connecting a central processing unit (CPU) to a printed circuit board (PCB) disclosed in U.S. Pat. No. 7,938,666 which is issued to Xiao on May 10, 2011 comprises a base having a plurality of terminals received therein, a cover mounted on the base and a cam actuating the cover sliding along the base. The base defines a first aperture extending therethrough. The cover has a second aperture aligning with the first aperture in vertical direction. The cam has a first cam portion and a second cam portion separately pre-formed and jointly combined and correspondingly received in the first and second apertures. The first cam portion includes a first disk, a second disk and an axle from the lower to the upper in turn. The second cam portion has a third disk and a fourth disk from the lower to the upper in turn. The third disk defines a cutout engaging with the axle of the first cam portion to assemble the first and second cam portions together. However, looseness or faults between the first and second cam portions may occur after a period of usage, so as to effective driving stroke of the cam.

Hence, it is desirable to provide an improved electrical connector to overcome the aforementioned disadvantages.

SUMMARY OF THE INVENTION

Accordingly, an object of the present invention is to provide an electrical connector having an actuating device with stable actuating performance.

According to one aspect of the present invention, an electrical connector for electrically connecting a central processing unit to a printed circuit board comprises a base having a plurality of terminals received therein and defining a first aperture extending therethrough, a cover attached to the base and defining a second aperture corresponding to the first aperture and an actuating device actuating the cover sliding along the base. The actuating device includes a rotating shaft, an eccentric wheel and a concentric wheel both assembled on the rotating shaft from top to bottom in turn. One of the rotating shaft, the eccentric and concentric wheels has a position rib, and the other two each has a receiving slot engaging with the position rib.

Other objects, advantages and novel features of the invention will become more apparent from the following detailed description when taken in conjunction with the accompanying drawings, in which:

DETAILED DESCRIPTION OF THE INVENTION

Figure 1:
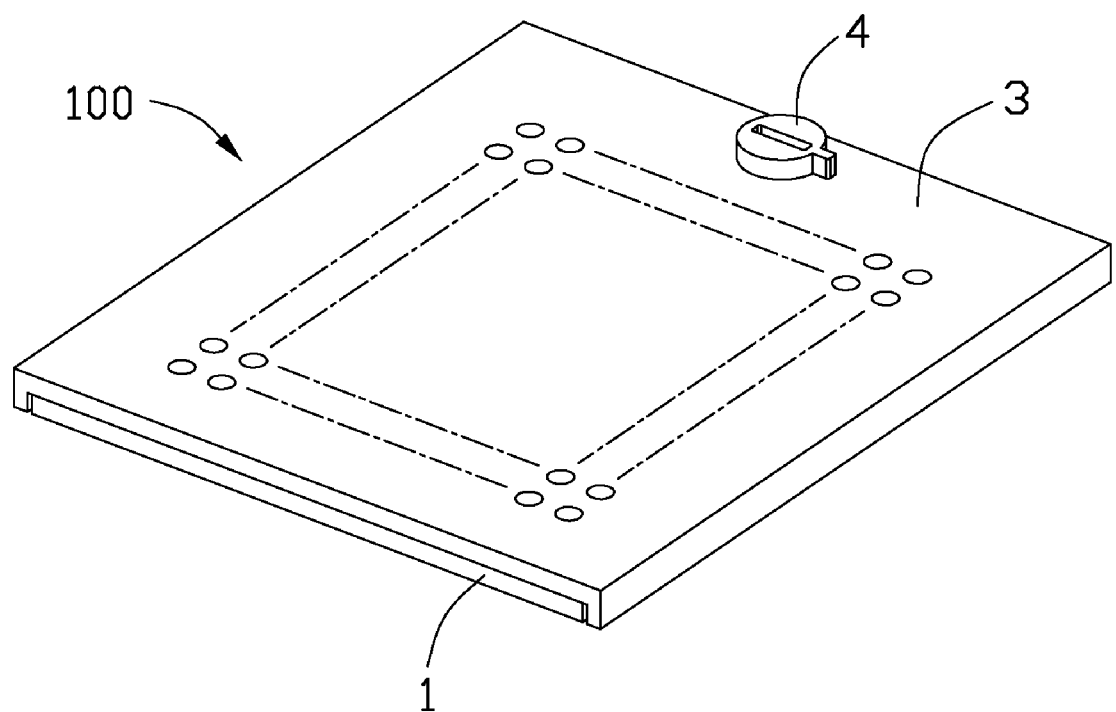
FIG. 1 is a perspective view of an electrical connector in accordance with a preferred embodiment of the present invention.

Reference will now be made to the drawings to describe the present invention in detail.

FIGS. 1-4 illustrate an electrical connector 100 for electrically connecting a chip module with a plurality of conductive pins (not shown) to a printed circuit board (not shown) comprises an insulating base 1 having a plurality of terminals 2 received therein, a cover 3 attached to the base 1, an actuating device 4 actuating the cover 3 sliding along the base 1 and an anchor 5 engaging with a bottom portion of the actuating device 4 to assemble the cover 3 and the base 1 together.

Figure 2:
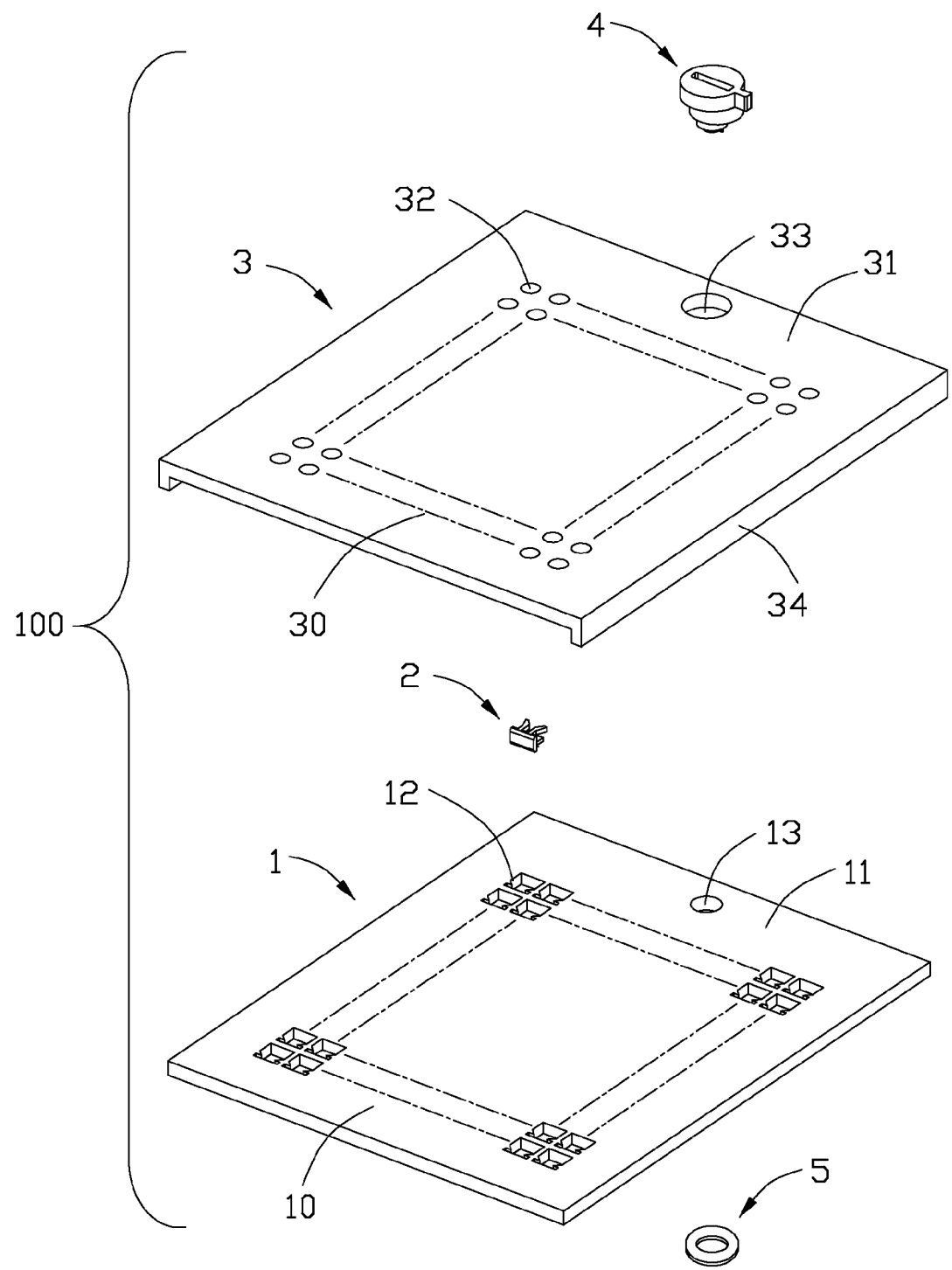
FIG. 2 is an exploded, perspective view of the electrical connector shown in FIG. 1.

Referring to FIG. 2, the base 1 configured with a plate-like structure includes a first main portion 10 defining a plurality of passageways 12 for receiving the terminal 2 and a first flat portion 11 extending from one end of the first main portion 10. The first flat portion 11 defines a first aperture 13 extending therethrough to receive corresponding portion of the actuating device 4.

The cover 3 arranged upon the base 1 includes a second main portion 30 corresponding to the first main portion 10 and a second flat portion 31 corresponding to the first flat portion 11. The second main portion 30 defines a plurality of through holes 32 extending therethrough and corresponding to the passageways 12 for the conductive pins of the chip module (not shown) passing through. The second flat portion 31 has a second aperture 33 aligning with the first aperture 13 of the base 1 in a vertical direction. A pair of sidewalls 34 extend downwardly from two sides of the cover 3 for covering corresponding sides of the base 1.

Figure 3:
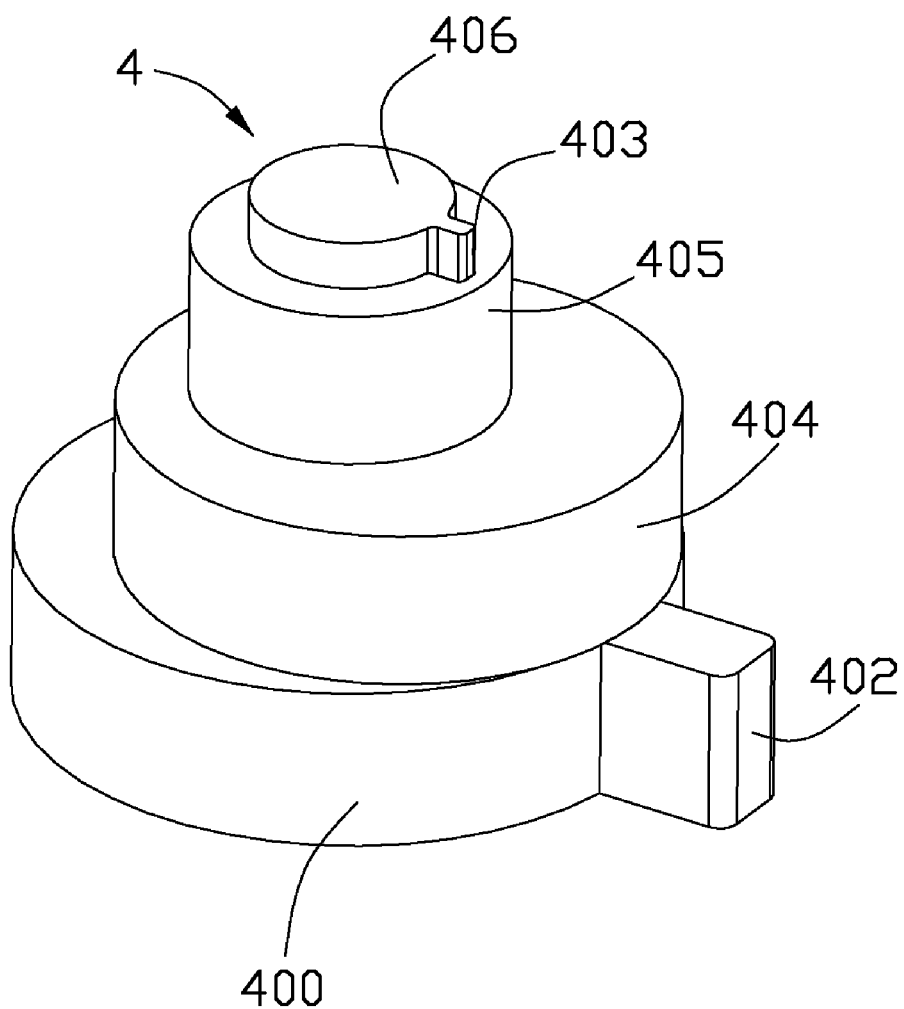
FIG. 3 is a perspective view of an actuating device of the electrical connector shown in FIG. 2.
Figure 4:
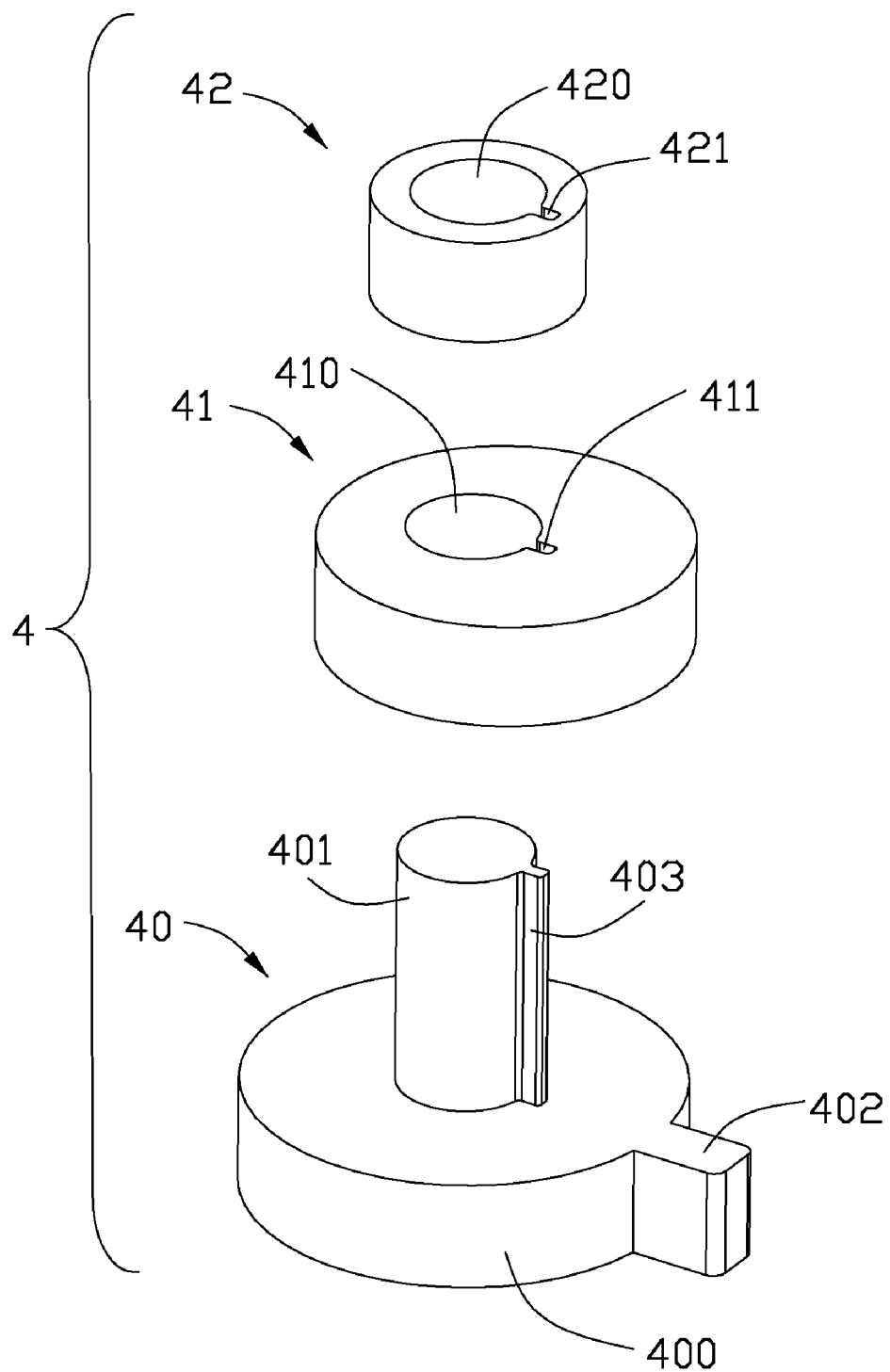
FIG. 4 is an exploded, perspective view of the actuating device of the electrical connector shown in FIG. 3.

Referring to FIGS. 2 to 4, the actuating device 4 has three separated parts commonly called as a rotating shaft 40 configured with a cylinder shape, an eccentric wheel 41 received in the second aperture 33 of the cover 3 and a concentric wheel 42 received in the first aperture 13 of the base 1. The rotating shaft 40 has a first step portion 400 with a cylinder shape and a coaxial rod 401 extending downwardly from the first step portion 400. The first step portion 400 forms a stopping portion 402 protruding along a radius direction thereof. A position rib 403 protrudes outwardly along a radius direction of the rotating shaft 40.

The eccentric wheel 41 actuating the cover 3 sliding along the base 1 has an eccentric hole 410 for the rotating shaft 40 passing through and a first slot 411 communicating with the eccentric hole 410. The eccentric hole 410 configured with a circular shape extends through the eccentric wheel 41 and has a radius approximately same with that of the rotating shaft 40. The first slot 411 extends along a radius direction of the eccentric hole 410 and has a size approximately same with the position rib 403. The first slot 411 has a rectangular shape and can interferingly engage with the position rib 403 to assemble the eccentric wheel 41 on the rotating shaft 40. The eccentric wheel 41 used as a cam constitutes a second step portion 404 of the actuating device 4 when assembled to the rotating shaft 40.

The concentric wheel 42 has a concentric hole 420 at a central portion thereof and a second slot 421 communicating with the concentric hole 420. The concentric hole 420 has a radius approximately same with that of the coaxial rod 401 and is used for the coaxial rod 401 of the rotating shaft 40 passing through. The second slot 421 is configured with a rectangular shape and extends along a radius direction of the concentric hole 420. The second slot 421 can interferingly engage with the position rib 403 to assemble the concentric wheel 42 on the rotating shaft 40. The concentric wheel 42 used as a stator constitutes a third step portion 405 of the actuating device 4 when assembled to the rotating shaft 40.

The coaxial rod 401 has an axial length longer than that of the eccentric wheel 41 add that of the concentric wheel 42. The coaxial rod 401 has an end portion exposed outside to form a fourth step portion 406 of the actuating device 4 when the eccentric and concentric wheels 41, 42 are assembled to the rotating shaft 40. The fourth step portion 406 extends beyond the bottom of the base 1 and can engage with the anchor 5 to assemble the electrical connector 100 together. The first, second, third and fourth step portions 400, 404, 405, 406 each later has a diameter smaller than the former. The first and second step portions 400, 404 are offset with each other, but the first step portion 400, the third step portion 405 and the fourth step portion 406 are coaxial with each other.

The actuating device 4 of the electrical connector 100 can be prevented from looseness faults caused by long-time used through the first slot 411 of the eccentric wheel 41 and the second slot 421 of the concentric wheel 42 both interferingly engaging with the position rib 403 of the rotating shaft 40.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
a base having a plurality of terminals received therein and defining a first aperture extending therethrough;
a cover slidably mounted on the base and defining a second aperture corresponding to the first aperture; and
an actuating device located between the base and cover, and actuating the cover moving on the base along a front-to-back direction, the actuating device including a rotating shaft having a position rib, an eccentric wheel and a concentric wheel assembled on the rotating shaft from an up-to-down direction, the eccentric wheel received in the second aperture to actuate the cover moving along the base having a first slot engaging with the position rib for assembling the eccentric wheel to the rotating shaft, and the concentric wheel received in the first aperture having a second slot engaging with the position rib to assemble the concentric wheel to the rotating shaft.

2. The electrical connector as claimed in claim 1, wherein the rotating shaft has a rod, and wherein the position rib is formed on the rod, and wherein the eccentric wheel and the rotating shaft are offset to each other when assembled together, and wherein the concentric wheel and the rotating shaft are coaxial with each other.

3. The electrical connector as claimed in claim 2, wherein the eccentric wheel has an eccentric hole for the rod passing through, and wherein the first slot is communicating with the eccentric hole.

4. The electrical connector as claimed in claim 2, wherein the concentric wheel has a concentric hole for the rod passing through, and wherein the second slot extends along a radius direction of the concentric hole and is communicating with the concentric hole.

5. The electrical connector as claimed in claim 2, wherein the rotating shaft defines a first step portion located on the rod, and wherein the first step portion and the rod are coaxial with each other, and wherein the first step portion has a stopping portion protruding outwardly therefrom.

6. The electrical connector as claimed in claim 1, wherein the base defines a first aperture for receiving the concentric wheel, and wherein the cover defines a second aperture aligning to the first aperture in a vertical direction, and the eccentric wheel is received in the second aperture to actuate the cover moving on the base in the front-to-back direction.

7. The electrical connector as claimed in claim 2, wherein the rod of the rotating shaft has an end portion exposed outside when the eccentric and concentric wheel are assembled on the rotating shaft.

8. The electrical connector as claimed in claim 7, wherein the electrical connector includes an anchor engaging with the end portion of the rod to assemble the actuating device on the base.

9. The electrical connector as claimed in claim 7, wherein the rod has an axial length longer than that of the eccentric wheel add that of the concentric wheel.

10. An electrical connector comprising:
a base having a plurality of terminals received therein and defining a first aperture extending therethrough;
a cover attached to the base and defining a second aperture corresponding to the first aperture; and
an actuating device including a rotating shaft defining a slot, a cam and a stator assembled on the rotating shaft from an up-to down direction, the cam received in the second aperture for actuating the cover moving on the base along a front-to-back direction and defining a first position rib interferingly engaging with the slot to assemble the cam on the rotating shaft, the stator received in the first aperture and defining a second position rib interferingly engaging with the slot to assemble the stator on the rotating shaft.

11. The electrical connector as claimed in claim 10, wherein the rotating shaft has a first step portion and a coaxial rod extending downwardly from the first step portion, and wherein the slot is formed on the rod.

12. The electrical connector as claimed in claim 10, wherein the base has a first aperture for receiving the stator, and wherein the cover has a second aperture corresponding to the first aperture to receive the cam.

13. The electrical connector as claimed in claim 10, wherein the cam has an eccentric hole for the coaxial rod passing through, and wherein the first rib extends into the eccentric hole along a radius direction of the eccentric hole.

14. The electrical connector as claimed in claim 13, wherein the stator has a concentric hole for the coaxial rod passing through, and wherein the second rib protrudes into the concentric hole along a radius direction of the concentric hole.

15. The electrical connector as claimed in claim 13, wherein the rotating shaft has a bottom end exposed outside when the cam and the stator are assembled on the rotating shaft, and wherein the electrical connector includes an anchor engaging with the bottom end of the rotating shaft to assemble the cover and the base together.

16. The electrical connector as claimed in claim 13, wherein the coaxial rod has an axial length greater than that of the cam plus that of the stator.

17. An electrical connector comprising:
a stationary base defining a first through hole essentially being of a circular configuration; a cover located upon the base in a vertical direction and being moveable relative to the base and defining a second through hole essentially being of a capsular configuration; and a metallic actuating device defining a rotation axis, in the vertical direction, about which the actuating device is rotated with in the vertical direction, an upper section upwardly exposed to an exterior for external access, a middle section movable in the second through hole, and a lower section movable in the first through hole; wherein an eccentric sleeve surrounds the middle section and is snugly received in the second through hole in a front-to-back direction perpendicular to said vertical direction;

wherein a concentric sleeve surrounds the lower section and is snugly received in the first though hole in both front-to-back direction and a transverse direction perpendicular to both the vertical direction and the front-to-back direction;

wherein an axial rib is formed on one of the eccentric sleeve and the middle section and an axial groove is formed in the other for aligning the eccentric sleeve with the middle section without relative rotation therebetween.

18. The electrical connector as claimed in claim 17, wherein said axial rib is formed on the middle section.

* * * * *